(12) United States Patent
Park

(10) Patent No.: US 8,072,019 B2
(45) Date of Patent: Dec. 6, 2011

(54) FLASH MEMORY AND MANUFACTURING METHOD OF THE SAME

(75) Inventor: Sung-Kun Park, Cheongiu-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 410 days.

(21) Appl. No.: 12/200,423

(22) Filed: Aug. 28, 2008

(65) Prior Publication Data

US 2009/0065840 A1    Mar. 12, 2009

(30) Foreign Application Priority Data

Sep. 7, 2007   (KR) .................. 10-2007-0090832

(51) Int. Cl.
    *H01L 29/788* (2006.01)
(52) U.S. Cl. ................ 257/315; 257/611; 257/E29.024
(58) Field of Classification Search .............. 257/610, 257/611, E29.024
    See application file for complete search history.

(56) References Cited

U.S. PATENT DOCUMENTS

| 6,159,803 A | 12/2000 | Hong et al. |
| 7,741,179 B2 * | 6/2010 | Shin ............................ 438/262 |
| 2006/0138524 A1 | 6/2006 | Kim |

* cited by examiner

*Primary Examiner* — Stephen W Smoot
(74) *Attorney, Agent, or Firm* — Sherr & Vaughn, PLLC

(57) ABSTRACT

A flash memory includes a shallow trench isolation and an active region formed at a substrate, a plurality of stacked gates formed on and/or over the active region, a deep implant region formed at a lower portion of the shallow trench isolation and the active region between the stacked gates and a shallow implant region formed at a surface of the active region between the stacked gates.

5 Claims, 5 Drawing Sheets

FLASH MEMORY AND MANUFACTURING METHOD OF THE SAME

This application claims priority under 35 U.S.C. §119 to Korean Patent Application No. 10-2007-0090832 (filed on Sep. 7, 2007), which is hereby incorporated by reference in its entirety.

BACKGROUND

Aspects of semiconductor manufacturing technology include nonvolatile memory devices such as a floating gate memory device or a metal insulator semiconductor (MIS) memory device constructed having two or more multilayered dielectric layers. The floating gate memory device embodies memory characteristics using a potential well and may be constructed in an electrically erasable programmable read only memory (EEPROM) tunnel oxide (ETOX) structure. The ETOX structure is a simple stack structure which is presently being the most widely applicable as an EEPROM, or a split gate structure having two transistors for each cell. On the other hand, MIS type memory device performs a memory function using a trap existing at a dielectric layer bulk, a dielectric layer/dielectric layer interface, and a dielectric layer/semiconductor interface. A metal/silicon oxide nitride oxide semiconductor (MONOS/SONOS) structure, which is being presently applicable as a flash EEPROM, is a representative example.

A flash memory device has a source connection layer that interconnects sources of respective unit cells to form a source line. In recent years, a source line, which is a dopant diffusion layer obtained through a self-aligned source (SAS) process to achieve high integration of the flash memory device, has been greatly applied as the source connection layer of the flash memory device.

Figure 1:
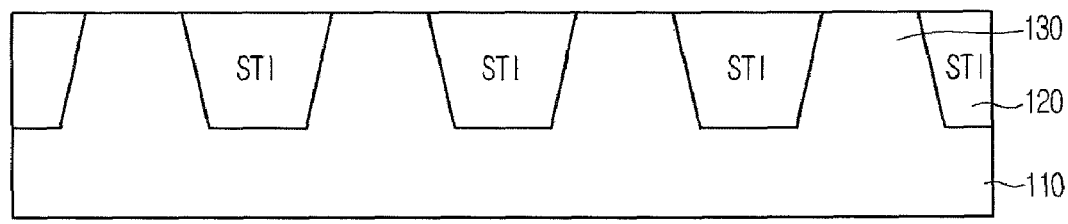
Figure 2:
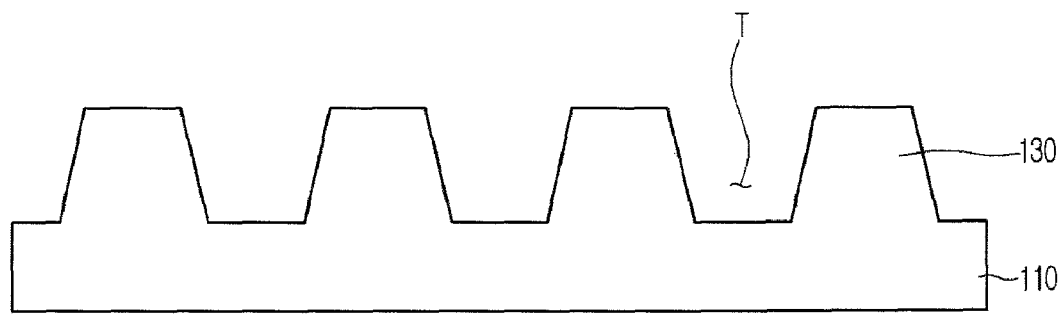
Figure 3:
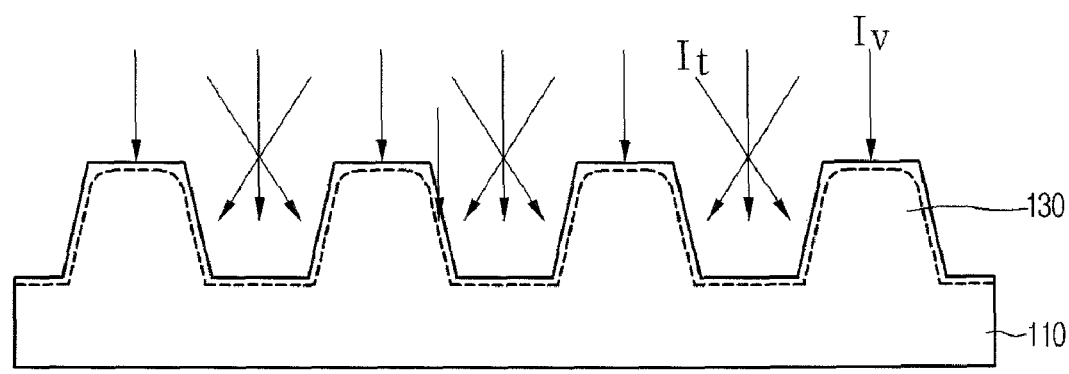

As illustrated in example FIG. 1, a method of forming a source line includes a step of forming shallow trench isolation 120 in substrate 110 to define active region 130. As illustrated in example FIG. 2, a stack gate is then formed on and/or over active region 130 and shallow trench isolation 120 is filled in the field region with, e.g., an oxide film, and is then etched by reactive ion etching (RIE) using a photoresist mask to form trench T. As illustrated in example FIG. 3, ions are implanted in substrate 110 where trench T is formed by double ion implantations, i.e., a vertical ion implantation ($I_v$) and a tilt ion implantation ($I_t$), to form common source 140 having laterally extending surface portions 141 and 143 and vertical surface portion 142 connected to each other as illustrated in example FIG. 4.

Figure 4:
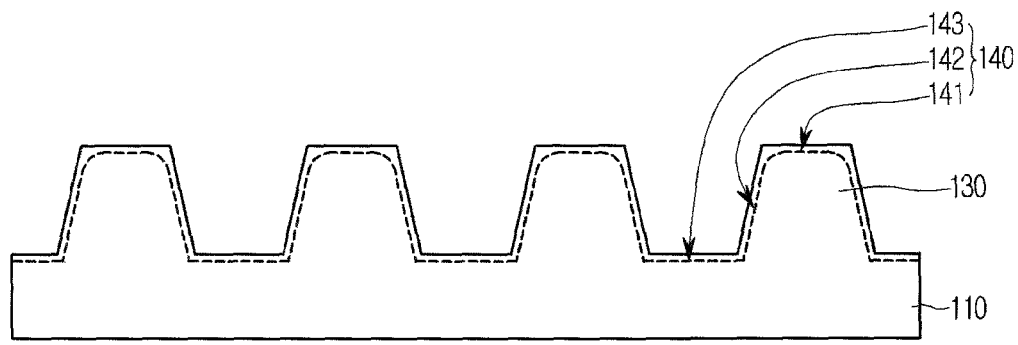

As illustrated in example FIG. 4, damage due to the RIE is removed through chemical dry etching (CDE) before the oxidation of a sidewall (SW). Specifically, the portion stressed due to the ion implantation and oxide film etching (oxide RIE) is removed by the CDE process. However, high etching selectivity between the oxide film and the substrate is required, and therefore, high-priced equipment is required, and an additional process is also required. Also, a margin is reduced at a subsequent photo process due to high step difference between the substrate and the etched shallow trench isolation. A read failure may also occur when a photoresist (PR) residue is generated at a valley portion of the portion where the shallow trench isolation is etched. For example, when the PR residue is generated at the valley portion, an oxide etch block is generated. Consequently, a subsequent ion implantation of a recessed common source (RCS) is blocked, with the result that a source line is not connected, and therefore, a floating phenomenon may occur. Also, an active damage is caused, when the shallow trench isolation is etched, with the result that annealing of the sidewall (SW) is required. When curing is not appropriately performed, dislocation occurs, with the result that a word line (W/L) stress failure may occur.

For example, the active damage may be caused, at the time of performing the oxide etching, as follows. While the source line is being etched, damage is caused at the active region adjacent thereto due to stress. As a result, the W/L stress is caused, and therefore, a stress failure may occur. Also, a CDE process and a SW annealing step are additionally required due to the damage to a control gate and a floating gate at the time of etching the shallow trench isolation. When curing is not appropriately performed, a retention failure may occur. For example, side poly damage is caused only at the source region at the time of performing the oxide etching at the recessed common source (PCS), with the result that an oxide film grows thinner than a drain region when forming oxide by a subsequent SW oxidation. Consequently, a retention failure occurs. In order to remove this phenomenon, it is required to remove the region where the damage is caused using CDE equipment which cause little damage. As a result, an additional process is required. Furthermore, the removal of the damaged regions using the CDE is an additional etching process, with the result that sheet resistance $R_s$ of the recessed common source (RCS) increases.

SUMMARY

Embodiments relate to a flash memory and a manufacturing method of the same that do not perform a field oxide etching step at the time of performing a recessed common source (RCS) process and secure characteristics of a common source less than the same sheet resistance ($R_s$), thereby simplifying the process and preventing the occurrence of problems which may occur while performing the process.

Embodiments relate to a flash memory that may include at least one of the following: a shallow trench isolation and an active region formed in a substrate; a plurality of stack gates formed on and/or over the active region; a deep implant region formed at a lower side of the shallow trench isolation and the active region between the stack gates; and a shallow implant region formed at a surface of the active region between the stack gates.

Embodiments relate to a manufacturing method of a flash memory that may include at least one of the following steps: forming a shallow trench isolation to define an active region in a substrate; and then forming a plurality of stack gates on the active region; and then forming a deep implant region at a lower side of the shallow trench isolation and the active region between the stack gates; and then forming a shallow implant region in a surface of the active region between the stack gates.

Embodiments relate to a method that may include at least one of the following steps: forming a trench isolation in a substrate defining an active region at a first depth; and then sequentially performing a first ion implantation process to form a first ion implantation region in the active region at a second depth, a second ion implantation process to form a second ion implantation region in the active region at a third depth and a third ion implantation process to form a third ion implantation region in the active region and the trench isolation at a fourth depth; and then forming a shallow implant region at the active region at a fifth depth.

DRAWINGS

Example FIGS. 1 to 4 illustrates of a flash memory.

Example FIGS. 5 to 9 illustrate a flash memory device and a manufacturing method of a flash memory in accordance with embodiments.

Figure 10:
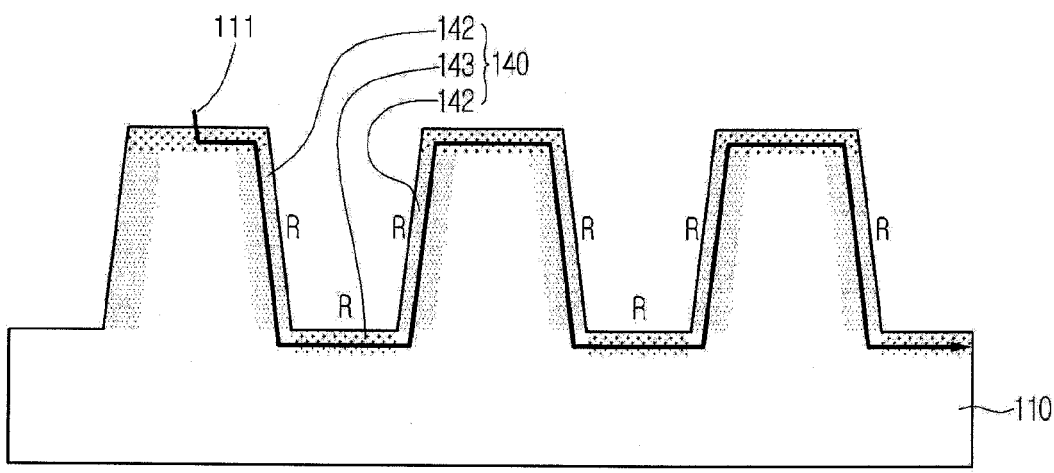

Example FIG. 10 illustrates a flash memory.

DESCRIPTION

Reference will now be made in detail to the preferred embodiments of the present invention, examples of which are illustrated in the accompanying drawings. Wherever possible, the same reference numbers will be used throughout the drawings to refer to the same or like parts. In the description of embodiments, forming something "on and/or under" each layer includes forming something directly to each layer or indirectly to each layer via another layer.

Figure 5:
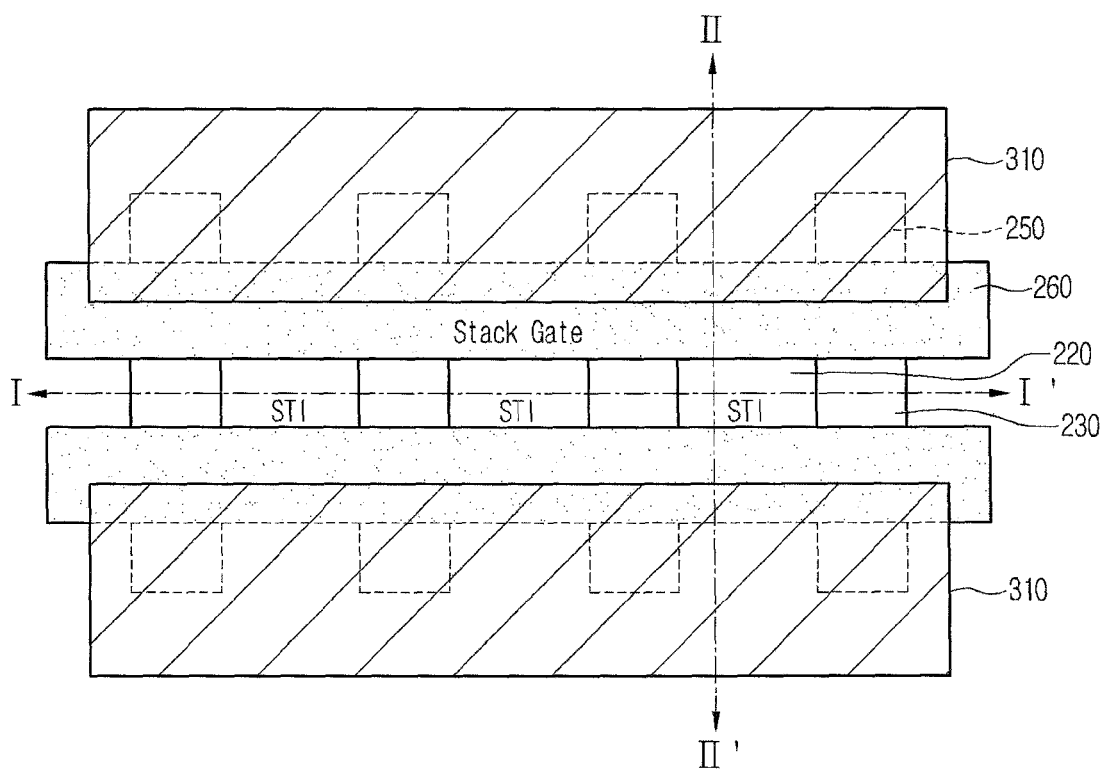
Figure 9:
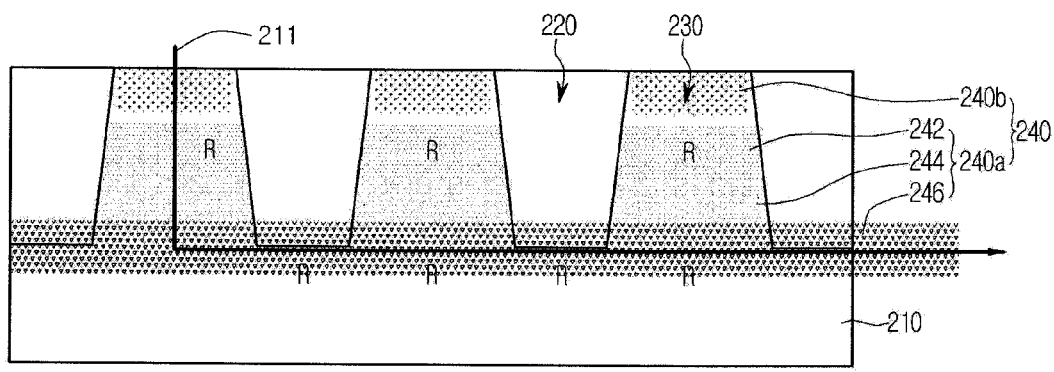

As illustrated in example FIGS. 5 and 9, a flash memory in accordance with embodiments includes shallow trench isolation 220 and active region 230 formed in substrate 210. A plurality of stacked gates 260 are formed on and/or over active region 230 and deep implant region 240a is formed extending between the middle and the lower region of shallow trench isolation 220 and active region 230 between the respective stacked gates 260. Shallow implant region 240b is formed at the upper region of active region 230 between the respective stacked gates 260. In accordance with embodiments, deep implant region 240a and shallow implant region 240b are electrically connected to each other to form common source 240. Each stacked gate 260 has a height greater than the depth of shallow trench isolation 220. FIG. 9 is a sectional view of a flash memory according to an embodiment of the present invention taken along line I-I' of FIG. 5.

Deep implant region 240a includes first ion implantation region 242 formed at active region 230 between stacked gates 260, and second ion implantation region 244 formed at active region 230 between stacked gates 260 and third ion implantation region 246 formed at the lower region of shallow trench isolation 220 and active region 230 between stacked gates 260. First ion implantation region 242 is formed at a depth less than that of shallow trench isolation 220. Third ion implantation region 246 is formed at a depth greater than that of shallow trench isolation 220. Second ion implantation region 244 is formed between first ion implantation region 242 and third ion implantation region 246. Particularly, second ion implantation region 244 is formed at a depth greater than that of first ion implantation region 242 but less than that of third ion implantation region 246. Third ion implantation region 246 may be formed in the shape of a straight line interconnecting the lower region of shallow trench isolation 220 and active region 230 between stacked gates 260. Meaning, the recessed common source (RCS) may be constructed in a three-dimensional structure, i.e., in a crooked pattern. However, in accordance with embodiments, the common source is connected in a straight line to the lower region of shallow trench isolation 220. Current path 211 follows the straight line path of common source region.

In other methods, an active etching process which increases sheet resistance ($R_s$) due to damage is removed, and thus, a reduction in variation of resistance as compared to an RCS method is achieved. Such a crooked connection is achieved in a three-dimensional structure to connect common source 140. On the assumption that sheet resistance $R_s$ of a unit surface is R, the total resistance necessary to reach an N-th active region is 3NR.

As illustrated in example FIG. 9, on the other hand, in accordance with embodiments, common source 240 includes deep implant region 240a and shallow implant region 240b. Also, a short circuit occurs vertically, common source 240 may be formed connected in a straight line to the lower region of shallow trench isolation 220. Specifically, resistance (R) is proportion to the length of a resistant object, and the total resistance decreases as the length of the resistance object decreases. In accordance with embodiments, regions connected to the common source below shallow trench isolation 220 are connected in a straight line to each other, and active region 230 and common source 240 are connected by implant regions 242, 244 and 246 in consideration of the above fact. At this time, since the sectional area relating to the resistance is very large as compared with other methods, the substantial resistance is reduced. Consequently, although doping having a concentration of approximately E13 and E14 is performed, embodiments provides the same effect as conventional doping having a concentration of approximately E15. As illustrated in example FIG. 9, the total resistance necessary to reach an N-th active region may be the same value as the conventional method, i.e., 3NR.

Figure 6:
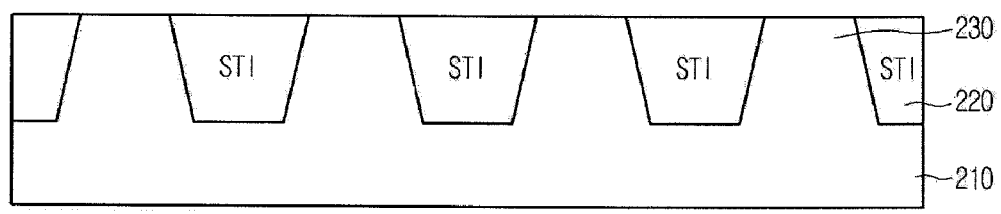

Example FIG. 5 illustrates a manufacturing method of a flash memory in accordance with embodiments. As illustrated in example FIG. 5, shallow trench isolation 220 and active region 230 are defined in substrate 210. Subsequently, a plurality of stacked gates 260 are formed on and/or over active regions 230. Photoresist pattern 310 is formed to cover drain region 250. A common source line region, i.e., I-I' line region is opened by photoresist pattern 310. Example FIG. 6 is a sectional view taken along line I-I' of example FIG. 5.

Figure 7:
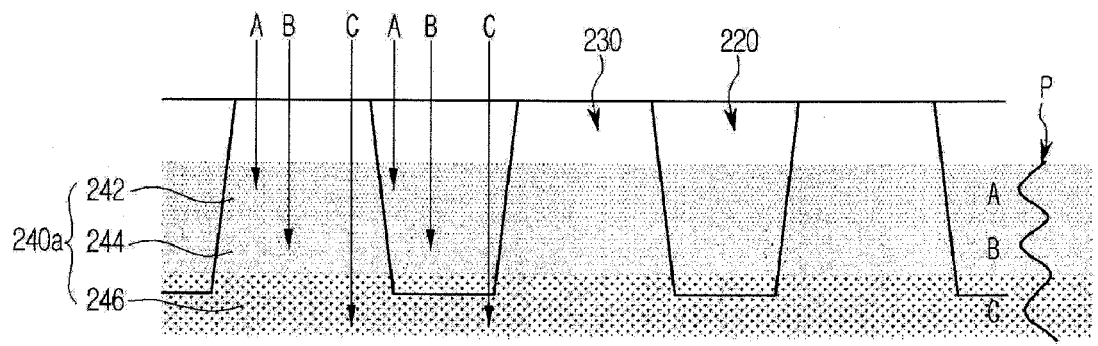

As illustrated in example FIG. 7, an ion implantation process is performed with respect to active region 230 and shallow trench isolation 220 to form deep implant region 240a in shallow trench isolation 220 and active region 230 between stacked gates 260. In accordance with embodiments, deep implant region 240a may be formed by performing an ion implanting process several times with respect to shallow trench isolation 220 and active region 230 between stacked gates 260. While it is possible to form deep implant region 240a by performing an ion implanting process three times, embodiments are not restricted to this, and thus, the ion implanting process may be performed twice or four or more times. For example, when the ion implanting process is performed three times, first ion implantation step (A) is carried out to form first ion implantation region 242 such that first ion implantation region 242 is formed at a depth less than that of shallow trench isolation 220. Subsequently, second ion implantation step (B) is carried out to form third ion implantation region 244 at shallow trench isolation 220 and active region 230 between stacked gates 260 such that second ion implantation region 244 is formed at a depth greater than that of first ion implantation region 242. Third ion implantation step (C) is then carried out to form third ion implantation region 246 at shallow trench isolation 220 and active region 230 between stacked gates 260 such that third ion implantation region 246 is formed at a depth greater than that of shallow trench isolation 220. In accordance with embodiments, third ion implantation region 246 may be connected in a straight line to the lower region of shallow trench isolation 220 and active region 230.

Figure 8:
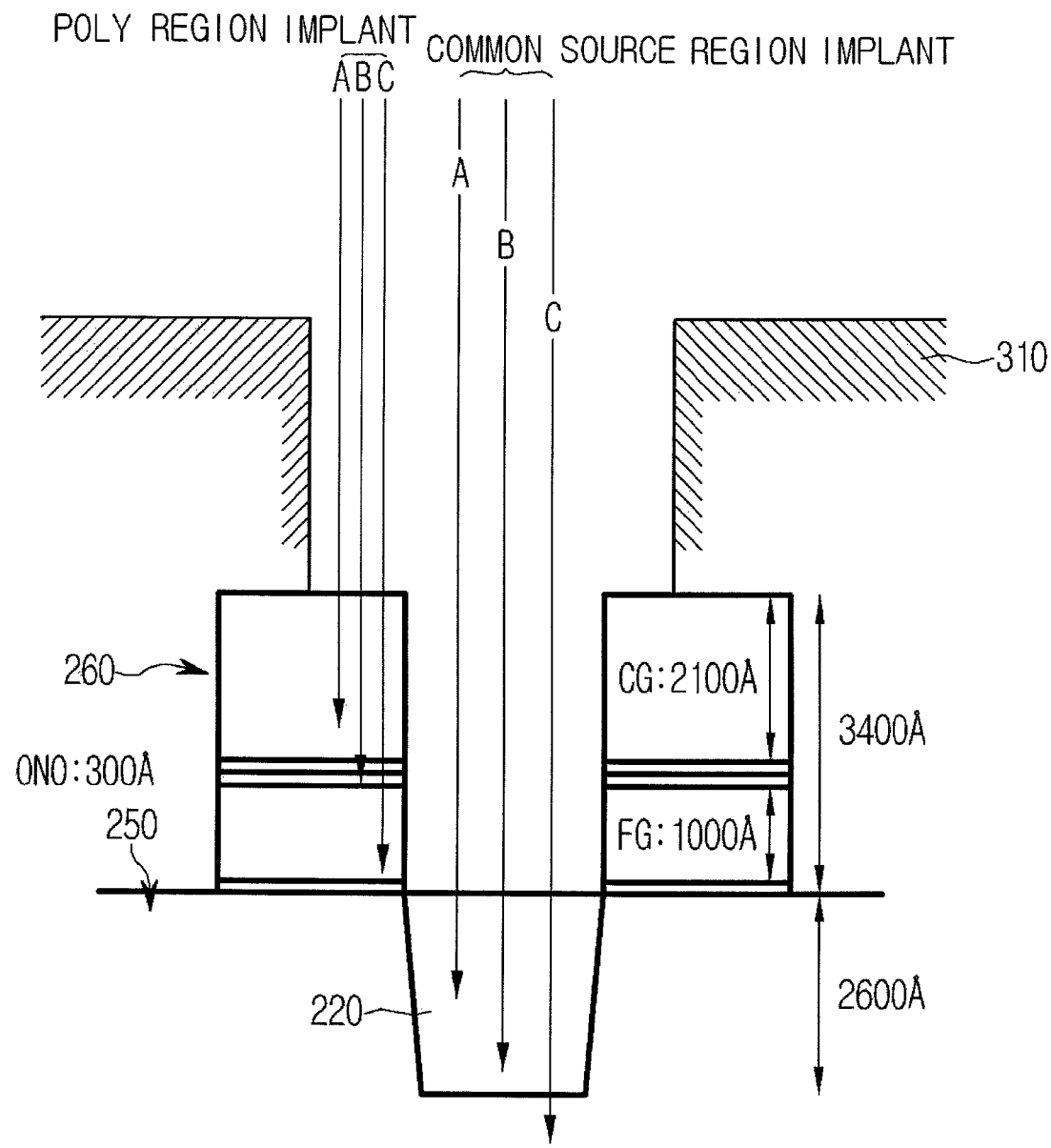

Example FIG. 8 is a sectional view taken along line II-II' of example FIG. 5. Some stacked gates 260 and drain region 250 are covered by photoresist pattern 310 and the common source region is thereby exposed by an etching process. In accordance with embodiments, the height or thickness of stacked gates 260 may be in a range of between 2800 Å to 3800 Å, preferably 3400 Å. The depth of shallow trench isolation 220 may be in a range between 2000 Å to 3000 Å, preferably 2600 Å. Accordingly, the height or thickness of stacked gates 260 may be greater than the depth of shallow trench isolation 220. For example, a self aligning method is used based on a fact that the thickness of stacked gates 260 is greater by approximately 800 Å than the depth of shallow trench isolation 220, and therefore, the process is carried out in a more efficient manner.

Moreover, an RIE is not carried out as compared with the performing of the ion implantation after the execution of the RIE according to other methods. Consequently, it is possible to prevent the reduction in process margin due to the difference of the depth profile and the stress caused by the RIE. Meaning, the thickness of the poly regions of stacked gates 260 is greater than the depth of shallow trench isolations 220 even at a portion not blocked by photoresist pattern 310. Accordingly, the blocking is carried out by the poly regions of stacked gates 260, and therefore, the entry into the channel is not achieved. Also, in accordance with embodiments, a shallow trench isolation (STI) etching step is omitted, and therefore, the step difference may be decreased to approximately 2000 to 4000 Å as compared with other methods. For example, the step difference may be decreased to approximately 2800 Å. As a result, a subsequent process margin is increased, and a possibility that a photoresist residue is generated is eliminated. For example, according to other methods, control gate having a thickness of 2100 Å+ONO having a thickness of 250 Å+floating gate having a thickness of 1000 Å+STI having a thickness of 2800 Å=a combined thickness of 6150 Å. On the other hand, in accordance with embodiments, control gate having a thickness of 2100 Å+ONO having a thickness of 250 Å+floating gate having a thickness of 1000 Å=a combined thickness of 3350 Å. Consequently, the height is reduced by approximately 54%.

In accordance with embodiments, deep implant region 240a is formed as follows through three ion implanting processes as illustrated in example FIG. 7. For example, when phosphorus (P) ions are used for the ion implantation, first ion implantation step (A) includes implanting phosphorus ions at an energy of approximately 120 to 150 KeV, preferably 135 KeV, and a dosage of 10 to $10^{14}/cm^2$ to form first ion implantation region 242 at projection range ($R_p$ or ion implantation peak) having a depth of approximately 1350 Å to 1650 Å, preferably 1500 Å. Then, second ion implantation step (B) includes implanting phosphorus ions at an energy of approximately 140 to 180 KeV, preferably 160 KeV, and a dosage of $10^{13}$ to $10^{14}/cm^2$ to form second ion implantation region 244 at a projection range ($R_p$ or ion implantation peak) having a depth of approximately 2000 Å to 2400 Å, preferably 2200 Å. Subsequently, third ion implantation step (C) includes implanting phosphorus (P) at an energy of approximately 140 to 220 KeV, preferably 200 KeV, and a dose of $10^{13}$ to $10^{14}/cm^2$ to form third ion implantation region 246 at a projection range ($R_p$ or ion implantation peak) having a depth of approximately 2500 Å to 2900 Å, preferably 2700 Å.

Alternatively, when arsenic (As) ions are used for the ion implantation, first ion implantation step (A) includes implanting arsenic ions at an energy of approximately 220 to 280 KeV, preferably 250 KeV, and a dosage of $10^{13}$ to $10^{14}/cm^2$ to form first ion implantation region 242 at a projection range ($R_p$ or ion implantation peak) having a depth of approximately 1350 Å to 1650 Å, preferably 1500 Å. Then, second ion implantation step (B) includes implanting arsenic ions at an energy of approximately 330 to 410 KeV, preferably 370 KeV, and a dosage of $10^{13}$ to $10^{14}/cm^2$ to form second ion implantation region 244 at a projection range ($R_p$ or ion implantation peak) having a depth of approximately 2000 Å to 2400 Å, preferably 2200 Å. Subsequently, the third ion implantation step (C) includes implanting arsenic ions at an energy of approximately 410 to 510 KeV, preferably 460 KeV, and a dosage of $10^{13}$ to $10^{14}/cm^2$ to form third ion implantation region 246 at a projection range ($R_p$ or ion implantation peak) having a depth of approximately 2400 Å to 3000 Å, preferably 2700 Å.

As illustrated in example FIG. 9, shallow implant region 240b is formed at the surface of active region 230 between stacked gates 260.

At the previous common source process, the lower portion of shallow trench isolation 220 at desired regions are connected by the deep ion implantation process. However, such connection is meaningless when the bottom of shallow trench isolation 220 and the surface of active region 230 are not connected to each other. However, in accordance with embodiments, when at least one selected from a group including cell source/drain (CSD) process, high-voltage lightly doped drain (HV LDD) process, and low-voltage lightly doped drain (LV LDD) process is performed as a method of connecting the bottom of shallow trench isolation 220 and the surface of active region 230, the process is carried out while shallow trench isolation 220 and active region 230 between stacked gates 260 are exposed. Consequently, it is possible to connect the bottom of shallow trench isolation 220 and the surface of the source line without performing any additional process.

For example, when a cell source/drain (CSD) process is adopted, arsenic (As) ions are used for the ion implantation process carried out at an energy of approximately 13 to 17 KeV, preferably 15 KeV, and a dosage of $2 \times 10^{14}/cm^2$ to form shallow implant region 240b at a projection range ($R_p$) having a depth of approximately 130 Å to 170 Å, preferably approximately 150 Å.

Alternatively, when a high-voltage lightly doped drain (HV LDD) process is adopted, phosphorus (P) ions are used for the ion implantation process carried out at an energy of 50 to 70 KeV, preferably approximately 60 KeV, and a dosage of $2 \times 10^{13}/cm^2$ to form shallow implant region 240b at a projection range ($R_p$) having a depth of approximately 720 Å to 880 Å, preferably 800 Å.

Alternatively, when a low-voltage lightly doped drain (LV LDD) process is adopted, arsenic (As) ions are used for the ion implantation process carried out at an energy of 36 to 44 KeV, preferably approximately 40 KeV, and a dosage of $2 \times 10^{14}/cm^2$ to form shallow implant region 240b at a projection range ($R_p$) having a depth of approximately 270 Å to 330 Å, preferably 300 Å.

For example, on the assumption that the maximum junction depth of the flash process using a high-voltage transistor (HV TR) is a minimum of approximately 1000 Å, the process for forming the common source may be performed from approximately 1500 Å. This means that the existing processes are used, and any additional process is not required.

As apparent from the above description, embodiments are advantageous for at least the following. It is possible to skip two essential RIE processes (RCS oxide RIE and etch damage CDE) used in other methods, thereby simplifying the process and preventing or retraining the occurrence of defectiveness which may be caused using other methods. Also, an additional ion implanting process is not required, and a RIE step is omitted. For example, in an ion implanting method, 0-degree ion implantation+tilt ion implantation are substituted in embodiments by deep ion implantation depending upon the depth of the shallow trench isolation (STI). Moreover, an STI etch step is omitted, and therefore, the step difference is decreased to approximately 2000 to 4000 Å as compared with other methods. For example, the step difference may be decreased to approximately 2800 Å. As a result, a subsequent process margin is increased, and a possibility that a photoresist residue (PR residue) is generated is eliminated. Even still, oxide etching is not performed in embodiments, with the result that damage to a control gate and a floating gate is minimized. While damage may occur during the deep ion implanting process, such damage is minimal when compared to the damage caused by oxide etching. Yet and still, since oxide etching is not performed, stress is not applied to the edge of the STI at the time of performing the RIE, and therefore, a failure does not occur. For example, a word line (W/L) stress failure occurs as the active region of the STI is damaged when a field at a recessed common source (RCS) region is removed. The etching is not performed, and therefore, stress due to the etch damage does not occur at the active edge region. Furthermore, in embodiments it is possible to remove the PR residue through the improvement of the step difference, thereby preventing the occurrence of defectiveness. In addition, it is possible to improve the PR uniformity at the time of performing a subsequent process, thereby improving CD uniformity and preventing the occurrence of coating defectiveness. Also, in other methods, the RCS is constructed in a three-dimensional structure, i.e., crooked, however, in embodiments the common source is connected in a straight line to the lower region of the STI and an active etching process, which increases sheet resistance ($R_s$) due to the cause of damage is removed. Therefore, it is possible to reduce variation of resistance as compared with other RCS methods.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A flash memory comprising:
   a shallow trench isolation layer and an active region formed at a substrate;
   a plurality of stacked gates formed on the active region;
   a deep implant region formed at a lower side of the shallow trench isolation layer and the active region between the stacked gates; and
   a shallow implant region formed at a surface of the active region between the stacked gates, wherein the deep implant region comprises:
   a first ion implantation region formed at the active region between the stacked gates at a depth less than that of the shallow trench isolation layer;
   a second ion implantation region formed at the active region between the stacked gates at a depth greater than that of the first ion implantation region; and
   a third ion implantation region formed at the lower region of the shallow trench isolation layer and the active region between the stacked gates at a depth greater than that of the shallow trench isolation layer,
   wherein the third ion implantation region is connected in a straight line to the lowermost portion of the shallow trench isolation layer and the active region between the stacked gates.

2. The flash memory of claim 1, wherein each of the stacked gates has a height greater than the depth of the shallow trench isolation layer.

3. The flash memory of claim 1, wherein the second ion implantation region is formed between the first ion implantation region and the third ion implantation region.

4. The flash memory of claim 1, wherein the shallow implant region is electrically connected to an upper side of the deep implant region.

5. The flash memory of claim 1, wherein the deep implant region and the shallow implant region form a common source.

* * * * *